United States Patent
Hamamura et al.

(10) Patent No.: US 9,714,993 B2
(45) Date of Patent: Jul. 25, 2017

(54) DETERMINATION OF SPECIFIC ABSORPTION RATE (SAR) IN MAGNETIC RESONANCE IMAGING (MRI)

(71) Applicant: TOSHIBA MEDICAL SYSTEMS CORPORATION, Otawara-shi (JP)

(72) Inventors: Yoshinori Hamamura, Moreland Hills, OH (US); Xin Chen, Beachwood, OH (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1167 days.

(21) Appl. No.: 13/739,236

(22) Filed: Jan. 11, 2013

(65) Prior Publication Data
US 2014/0197836 A1    Jul. 17, 2014

(51) Int. Cl.
*G01R 33/28* (2006.01)
*G01R 33/44* (2006.01)
*G01R 33/36* (2006.01)

(52) U.S. Cl.
CPC ........... *G01R 33/44* (2013.01); *G01R 33/288* (2013.01); *G01R 33/36* (2013.01)

(58) Field of Classification Search
CPC ...... G01R 33/288; G01R 33/36; G01R 33/44; G01R 33/5612; G01R 33/3614; G01R 33/34; G01R 33/34007
USPC ................................................. 324/300–322
See application file for complete search history.

(56) References Cited

U.S. PATENT DOCUMENTS

| | | | |
|---|---|---|---|
| 7,397,243 B1 * | 7/2008 | Bulkes ............... | G01R 33/3614 324/307 |
| 2003/0069619 A1 * | 4/2003 | Fenn ..................... | A61B 18/18 607/101 |
| 2006/0047198 A1 * | 3/2006 | Sugimoto ............. | A61B 5/055 600/410 |
| 2007/0279058 A1 * | 12/2007 | Bulkes ............. | G01R 33/34076 324/314 |
| 2008/0157765 A1 * | 7/2008 | Fontius ............... | G01R 33/5612 324/309 |
| 2010/0244840 A1 * | 9/2010 | McKinnon .......... | G01R 33/288 324/322 |

(Continued)

OTHER PUBLICATIONS

"Dipoles". Wikipedia. Date viewed: Oct. 25, 2016. <https://en.wikipedia.org/wiki/Dipole>.*

(Continued)

*Primary Examiner* — Melissa Koval
*Assistant Examiner* — Rishi Patel
(74) *Attorney, Agent, or Firm* — Nixon & Vanderhye P.C.

(57) ABSTRACT

A magnetic resonance imaging (MRI) system includes static and gradient magnetic field generators, at least one radio frequency (RF) coil, at least one RF transmitter and at least one RF receiver. At least one power consumption monitor is coupled to locally measure power consumed by the RF coil. The MRI control system has at least one computer configured to determine a specific absorption rate (SAR) for a patient coupled to the RF coil based on at least: (a) RF power transmitted to said RF coil while the RF coil is inductively coupled to the patient, and (b) an electrical signal output from the at least one power consumption monitor while the RF coil is inductively coupled to the patient.

25 Claims, 11 Drawing Sheets

(56) References Cited

U.S. PATENT DOCUMENTS

| | | | | |
|---|---|---|---|---|
| 2011/0241681 | A1* | 10/2011 | Gudino | G01R 33/34 |
| | | | | 324/318 |
| 2012/0086449 | A1 | 4/2012 | Graesslin et al. | 309/318 |
| 2013/0082707 | A1* | 4/2013 | Biber | G01R 33/583 |
| | | | | 324/309 |
| 2014/0015547 | A1* | 1/2014 | Bottomley | G01R 21/00 |
| | | | | 324/647 |

OTHER PUBLICATIONS

NEMA Standards Publication MS 8-2008, Characterization of the Specific Absorption Rate for Magnetic Resonance Imaging Systems, pp. 1-15, published by National Electrical Manufacturers Association, Rosslyn, VA (2008).

El-Sharkawy, et al., "A multichannel, real-time MRI RF power monitor for independent SAR determination," *Med. Phys.*, vol. 39, No. 5, pp. 2334-2341 (May 2012).

Graesslin, et al., "Real-time SAR Monitoring to ensure Patient Safety for Parallel Transmission Systems," *Proc. Intl. Soc. Mug. Reson. Med.*, vol. 15, p. 1086 (2007).

Graesslin, et al,, "Real-time Global and Local SAR Monitoring for Parallel Transmission Systems," *Proc. Intl. Soc. Mug. Reson. Med.*, vol. 17, p. 302 (2009).

Graesslin, "Parallel Transmission: A Comprehensive RF Safety Concept," *PIERS Proceedings*, Cambridge, USA, pp. 698-700 (Jul. 2-6, 2008).

\* cited by examiner

B1 map, non-conductive phantom: uniform field.

FIG. 2b

Cylindrical conductive phantom: enhanced center by dielectric resonance.

FIG. 2c

Human abdomen: non-uniform to MRI system
controller
22

DETERMINATION OF SPECIFIC ABSORPTION RATE (SAR) IN MAGNETIC RESONANCE IMAGING (MRI)

TECHNICAL FIELD

The subject matter below relates generally to magnetic resonance imaging (MRI) apparatus and process. In particular, the MRI apparatus and method described below involve the determination of specific absorption rate (SAR) in MRI.

DETAILED DESCRIPTION

Figure 1:
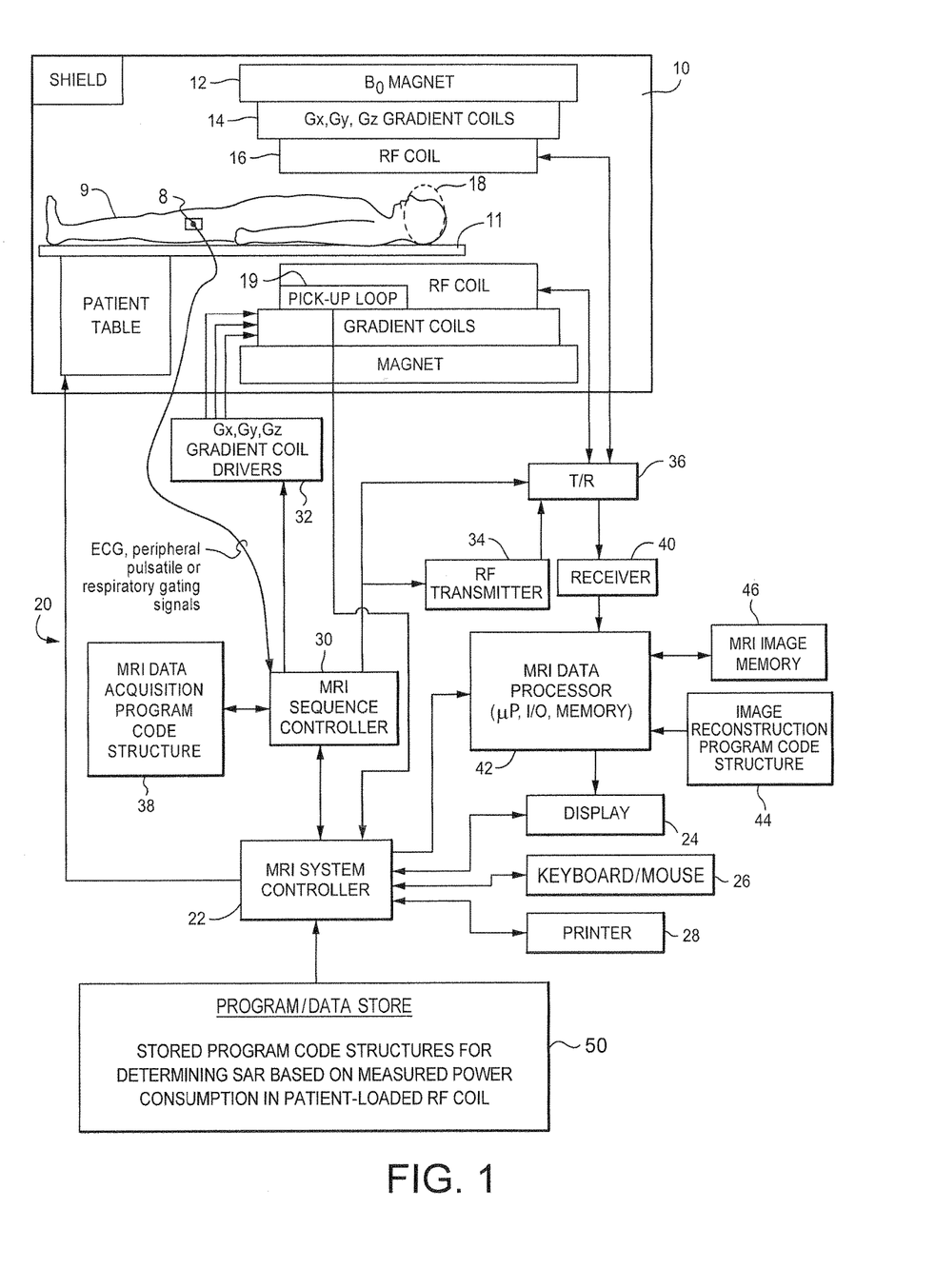
FIG. 1 is a high-level schematic block diagram of an exemplary MRI system embodiment configured to more accurately determine SAR.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field Bo magnet 12, a Gx, Gy and Gz gradient coil set 14 and an RF coil assembly 16. Along the horizontal axis of this cylindrical array of elements is an imaging region 18 shown as substantially encompassing the anatomy of interest (i.e., region of interest or "ROI") for a patient 9 (e.g., the head) supported by a patient bed or table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as RF transmitter 34 and transmit/receive switch 36 (if the same RF coil is used for both transmission and reception). As those skilled in the art will appreciate, many different types of RF coils (e.g., whole body coils, surface coils, birdcage coils, coil arrays, etc.) may be employed to transmit and/or receive RF signals to/from the ROI in the imaging volume. As will also be appreciated, one or more suitable physiological transducers 8 may be affixed to the patient's body (at a suitable location) to provide ECG (electrocardiogram), respiratory and/or peripheral pulsatile gating signals to the MRI sequence controller 30. The MRI sequence controller 30 also has access to suitable program code structure 38 for implementing MRI data acquisition sequences already available in the repertoire of the MRI sequence controller 30. In this exemplary embodiment, a pickup loop 19 is inductively coupled to the RF coil so as to monitor the B1 RF magnetic field locally near the coil (i.e., to monitor RF current flowing in a coil conductor) during transmission of an RF pulse. The pickup loop is connected to the MRI system controller 22 in this embodiment to provide an input signal/data for calculating SAR. As will be explained, any other probe capable of measuring RF power consumption in the coil may be used instead.

The MRI system 20 includes an RF receiver 40 providing input to data processor 42 so as to create processed image data which may be sent to display 24 (or elsewhere, e.g., to storage for later viewing). The MRI data processor 42 is also configured for access to image reconstruction program code structure 44 and to MR (magnetic resonance) image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for determining SAR based on a B1 RF field measurement) (a) while the RF coil is patient-loaded for MRI scanning of the patient, and (b) while the RF coil is unloaded (e.g., during a pre-scan calibration mode), a related graphical user interface (GUI), operator inputs to same, etc. are stored in computer readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those skilled in the art will appreciate, the FIG. 1 depiction is a very high level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real world physical events and conditions (e.g., the tissues of a patient over an imaged region space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to acquire and/or process MRI data acquisitions and/or to generate and display MR images.

A pulse energy method as described in NEMA (National Electrical Manufacturers Association) Standards Publication MS 8-2008 is commonly used for calculating SAR (Specific Absorption Rate) in MRI. As will be understood, there are prescribed health and safety standards that limit the SAR so as to prevent patient damage during MRI. The NEMA standard calculates power absorbed by a patient by subtracting the RF power absorbed by the scanner ($P_{coil}$) from the total RF power (P) transmitted by the RF coil, the difference being divided by the patient's weight.

$$SAR = \frac{1}{\text{weight}}(P - P_{coil}) \qquad \text{[Equation 1]}$$

NEMA MS 8-2008 specifies $P_{coil}$ to be measured as the transmitted RF power required when the scanner is unloaded (i.e., no patient is present). The underlying assumption is that the power absorbed by the scanner when a patient is later loaded into it (i.e., the real definition of $P_{coil}$) is equal to the RF power absorbed when the scanner is not loaded (i.e., the measured power). In other words, it is assumed that between actual patient-loaded imaging and earlier unloaded calibration measurements, the required B1 RF field is the same and thus the same current will flow in the transmit coil and the same power is consumed in the scanner.

Figure 2A:
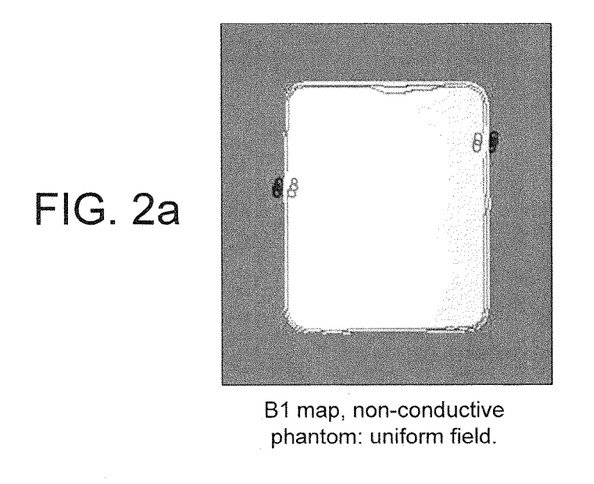
FIGS. 2a-2c are maps of B1 RF magnetic field distribution for a non-conductive phantom, a cylindrical conductive phantom and a human abdomen, respectively.
Figure 2B:
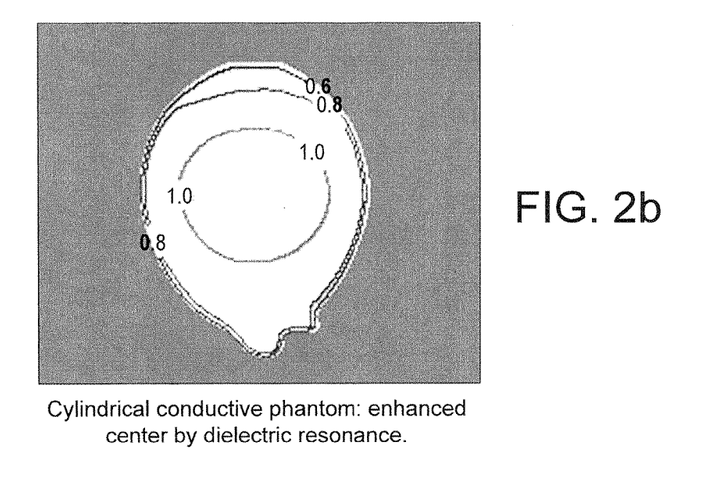
Figure 2C:
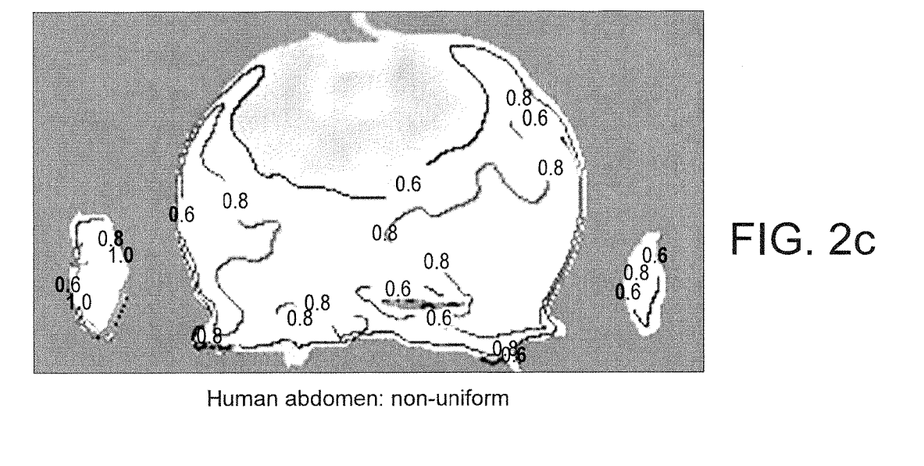

However, in a 3 T (3 Tesla) or higher magnetic field, the resulting higher Larmor frequency causes more eddy currents and dielectric effects in the human body. This results in non-uniform distribution of B1 RF fields—as shown in FIGS. 2a, 2b and 2c. In FIG. 2a, the B1 field map for a non-conductive phantom presents a fairly uniform field distribution. In FIG. 2b, a cylindrical conductive phantom presents enhanced center B1 RF field distribution caused by dielectric resonance. In FIG. 2c, a human abdomen presents a substantially more non-uniform B1 RF field distribution.

In short, the assumption embedded in the NEMA pulse energy method is not true—especially at high frequencies. Table 1 below shows $P_{coil}$ is not the same between different imaging samples (simulation result). This causes errors in a traditional SAR calculation that degrades imaging performance or makes an unsafe patient environment.

TABLE 1

| Phantom | Power (w) | $P_{coil}$ (w) |
|---|---|---|
| 30 L saline × 3 | 15190 | 9903 |
| 25 L CuSO$_4$ | 3361 | 3184 |
| 2.7 L mineral oil | 6467 | 6467 |

A proper definition for $P_{coil}$ is the actual RF power absorbed by the scanner. A cause of the problem noted above is using the unloaded power as something equal to $P_{coil}$, which is not accurate in a high B1 RF field situation.

One solution is to measure actual RF current passing along the transmit coil conductor and then to correct the SAR calculation (since the transmit coil is the dominant source of power absorption in the MRI scanner). The revised SAR calculation equation is:

$$SAR = \frac{1}{\text{Weight}}\left\{P_{scan} - P_{unloaded} \cdot \left(\frac{I_{scan}}{I_{unloaded}}\right)^2\right\} \qquad \text{[Equation 2]}$$

SAR (Specific Absorption Rate) is defined as the energy absorbed by patient tissue per second per kg, which is an important parameter in MRI for patient safety. It is calculated based on the power absorbed by a patient divided by the patient's weight:

$$SAR = \frac{P_{patient}}{\text{weight}}(\text{w/kg}) \qquad \text{[Equation 3]}$$

The RF power going into the patient tissues is calculated by subtracting (a) the RF power absorbed by the scanner from (b) the total incident RF power:

$$P_{patient} = P_{total} - P_{coil} \qquad \text{[Equation 4]}$$

The conventional method of measuring the power $P_{coil}$ absorbed by the scanner is to assume it is equivalent to the power absorbed by the unloaded coil (e.g., since the scanner adjusts the NMR nutation flip angle to have the same B1 RF field). This assumes the same current flows in the transmit coil and the same RF power is consumed in the coil—despite variations in patient size, weight, etc.:

$$SAR = \frac{1}{\text{weight}}(P_{scan} - P_{unloaded}) \qquad \text{[Equation 5]}$$

However, this assumption is not accurate in a high RF field case as the scattered RF field caused by the patient body (e.g., due to eddy currents and dielectric effects) becomes dominant.

The measurement of power absorbed in the scanner should be modified. If RF coil current when a patient is loaded into the coil could be measured, then $P_{coil}$ could be calculated by:

$$P_{coil} = I^2_{scan} \cdot R_{coil} \qquad \text{[Equation 6]}$$

where $I_{scan}$ is the current in the coil when a patient is loaded therein, and $R_{coil}$ is the resistance of the transmit coil.

When the scanner is unloaded, the equation becomes:

$$P_{unloaded} = I^2_{unloaded} \cdot R_{coil}$$

since the coil resistance does not change, substituting the second equation into the first becomes:

$$P_{coil} = \left\{\left(\frac{I_{scan}}{I_{unloaded}}\right)^2\right\} \cdot P_{unloaded} \qquad \text{[Equation 7]}$$

Therefore, SAR can be calculated as:

$$SAR = \frac{1}{\text{weight}}\left\{P_{scan} - P_{unloaded} \cdot \left(\frac{I_{scan}}{I_{unloaded}}\right)^2\right\} \qquad \text{[Equation 8]}$$

This can then provide a SAR measurement even when B1 and current on the coil are not constant and/or are unknown.

To thus calculate SAR, the current ratio ($I_{scan} \div I_{unloaded}$) has to be measured.

Figure 3A:
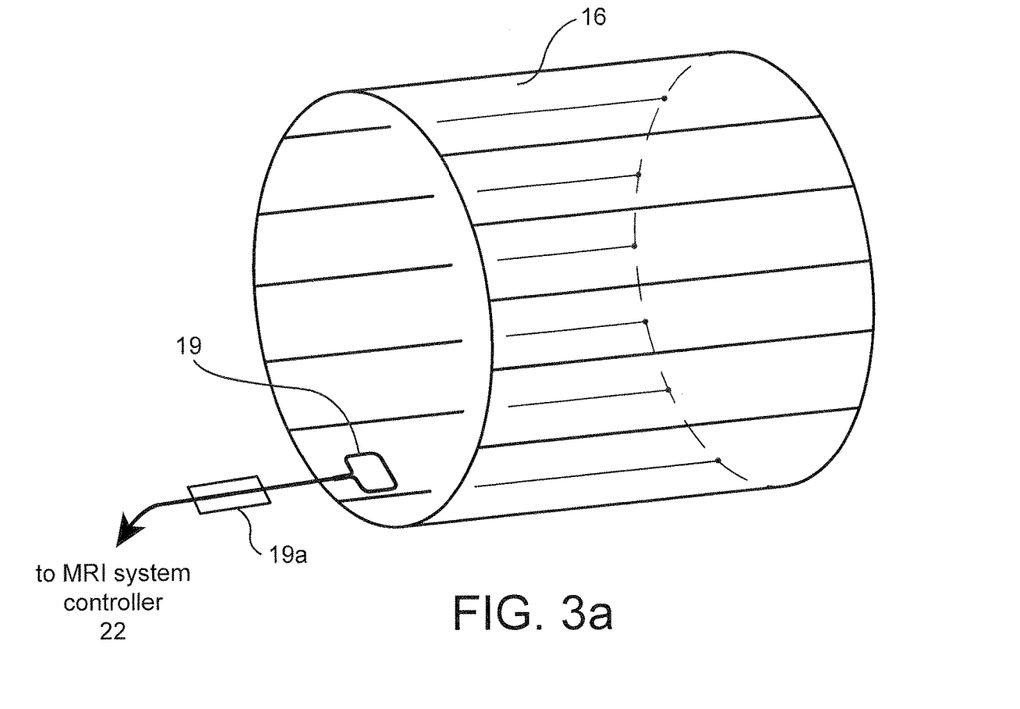
FIGS. 3a-3b are schematic depictions of an RF coil and a small inductively coupled pickup loop for monitoring RF current flowing in at least one conductor of the RF coil.
Figure 3B:
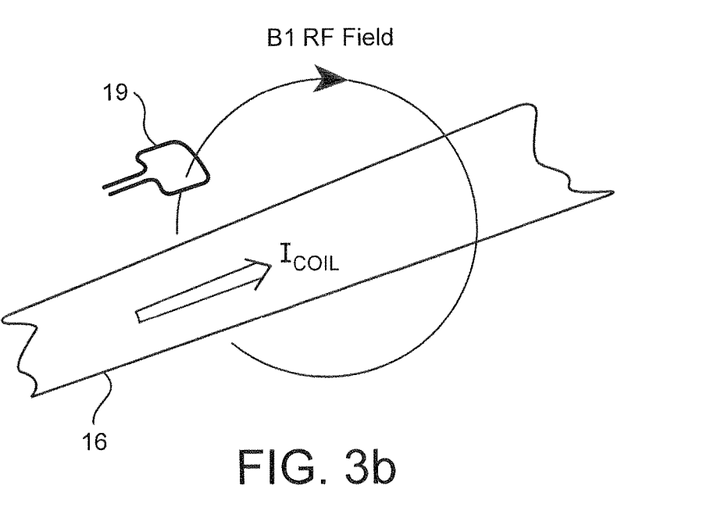

For this purpose, as depicted in FIGS. 1 and 3a, one or more small pickup loops 19 (e.g., with an associated balun 19a to prevent disturbance (by the cable from loop 19) of the birdcage coil function) are placed beside the transmit coil element(s) 16 (e.g., a birdcage body coil is depicted in FIGS. 3a and 3b). As depicted in FIG. 3b, the loop inductively couples to the local magnetic (B1) RF field that is not affected by the scattered field created by the patient body. In this embodiment, small pickup loop 19 is placed in the coil 16 to inductively pick up B1 RF field created by the current $I_{coil}$ in the coil conductor 16. Thus, the field is proportional to the current $I_{coil}$ in the coil element.

Placing a pickup loop into MRI transmit coils is commonly done to measure the produced B1 RF field. However, such loops typically measure global magnetic field instead of the local field relative to current on the coil. Usually, such pickup loops are placed between transmit coil elements to avoid a local current effect. By contrast, the loop in FIGS. 3a-3b is a coil element purposefully to pick up a voltage related to the local current. Other types of current/power monitors are discussed below in connection with FIGS. 5, 6A, 6B, 7A, 7B and 8.

The loop(s) should be pre-calibrated at some point in an unloaded condition. Therefore, the relative induced voltages measured as output from loop 19 equals the relative coil currents (even though the current itself is not directly measured):

$$\frac{V_{scan}}{V_{unloaded}} = \frac{I_{scan}}{I_{unloaded}} \qquad \text{[Equation 9]}$$

In a calibration mode, pickup loop voltage is measured in an unloaded condition to derive $V_{unloaded}$. Required peak RF power in this unloaded condition is also measured to derive $P_{unloaded}$. The results can then be stored for later use.

In a scan mode, pickup loop voltage is measured in a patient-loaded condition to derive $V_{scan}$. Required peak RF power in this loaded condition is also measured to derive $P_{scan}$. Then, SAR can be calculated as:

$$SAR = \frac{1}{\text{weight}}\left\{P_{scan} - P_{unloaded} \cdot \left(\frac{V_{scan}}{V_{unloaded}}\right)^2\right\}$$

In this way, increased accuracy of SAR calculation at high field MRI (e.g., 3 T and more) may be obtained.

Small pickup loops are used as current probes. Off the shelf current probes typically use a ferrite core. Removing the core, it becomes a hollow core toroid such as a Rogowski coil. Still, toroids may be too thick to implement into the coils needed here and thus this example uses small pickup loops.

Figure 3C:
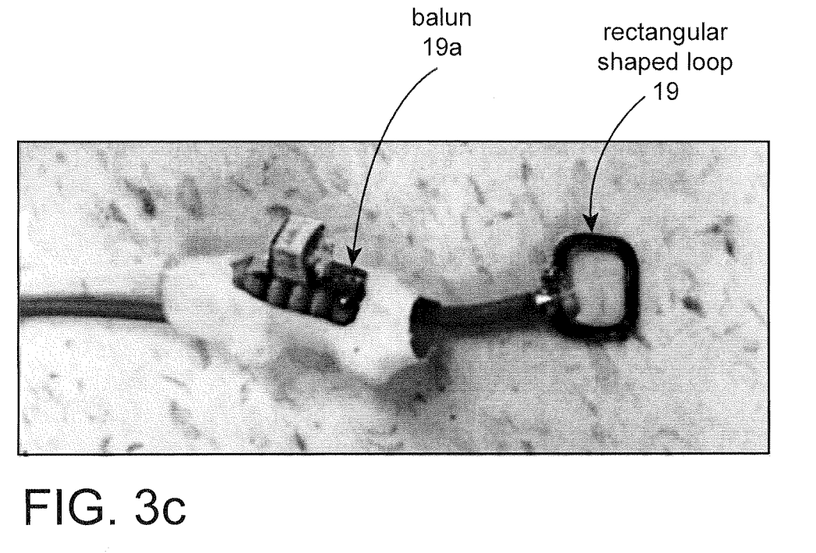
FIGS. 3c-3d depict an exemplary small rectangular loop and an exemplary butterfly (figure-eight) loop, respectively.

A small rectangle loop is shown in FIG. 3c. It is placed beside a transmit coil conductor element to receive a local magnetic field.

Figure 3D:
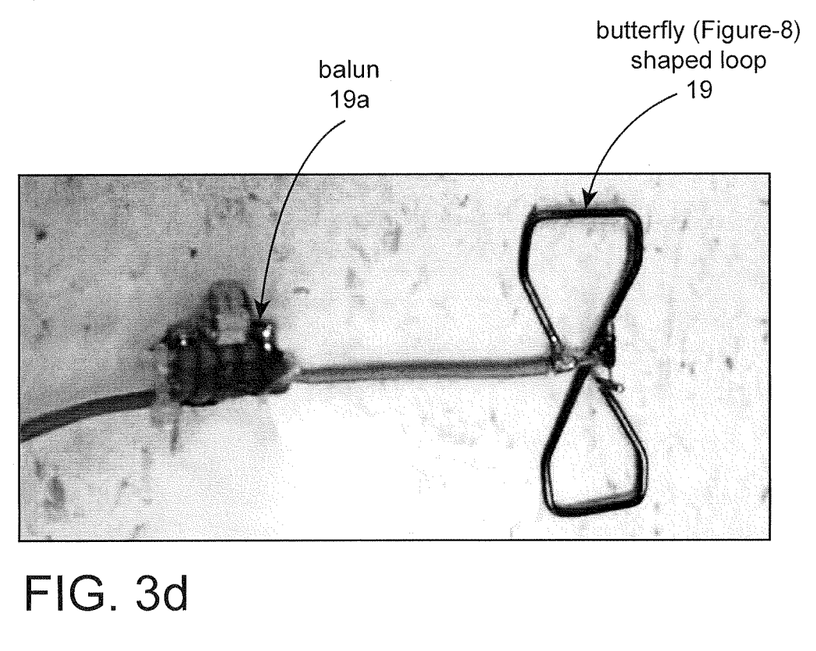

A butterfly (figure-eight) loop is shown in FIG. 3d. It is placed over a transmit coil conductor element. As such a figure-eight loop cancels induced voltage by a uniform magnetic field, substantially only a local field created by the element RF current is detected.

Figure 3E:
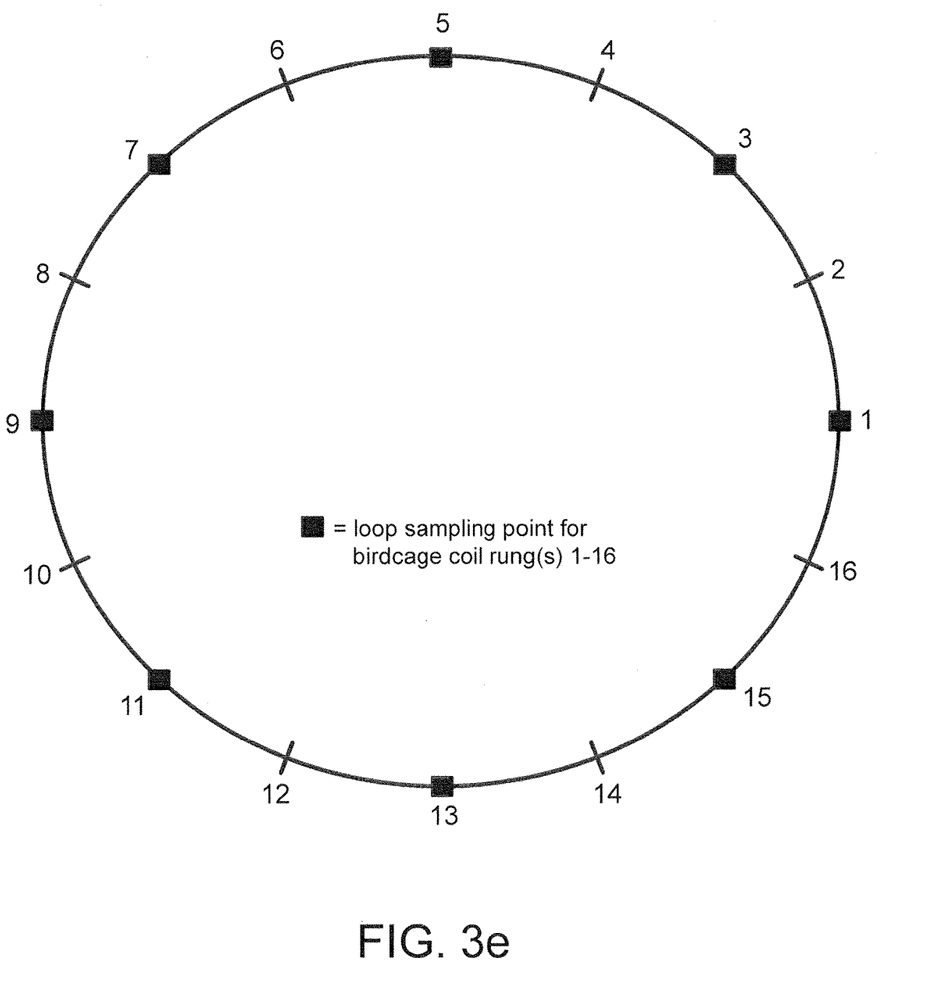
FIG. 3e is a schematic cross-section of a birdcage head coil showing possible coil rung current sampling points for pickup coil locations.
Figure 3F:
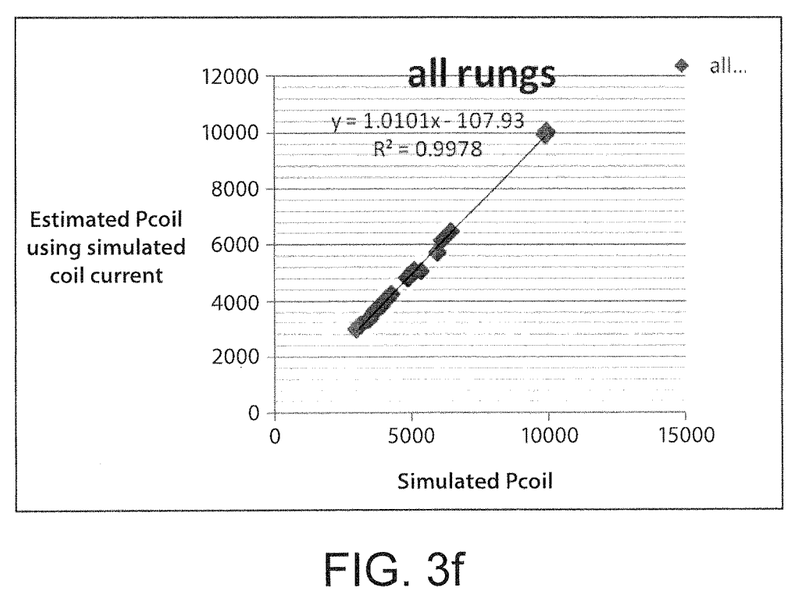
FIGS. 3f-3i show estimated $P_{coil}$ using coil current versus simulated $P_{coil}$ for various combinations of birdcage coil rung sampling points.
Figure 3G:
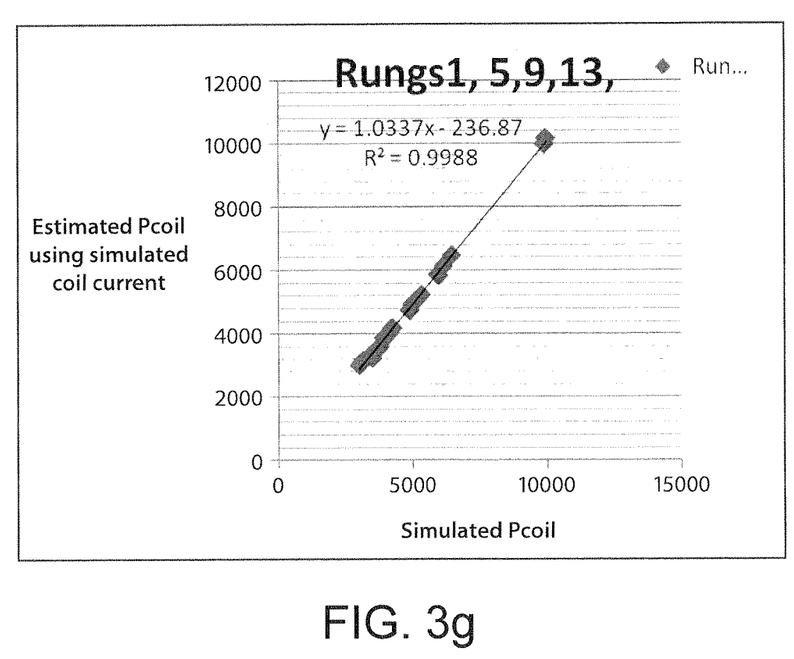
Figure 3H:
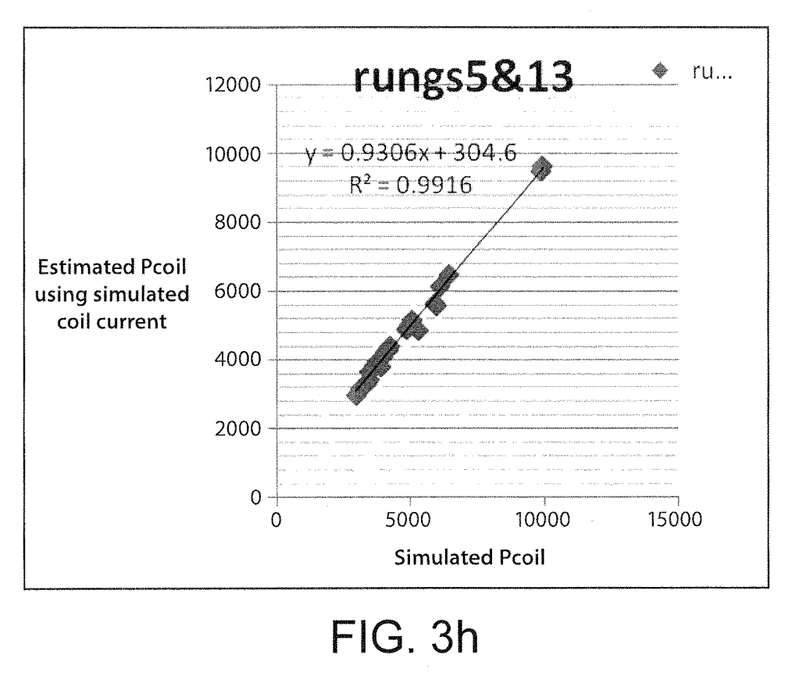
Figure 3I:
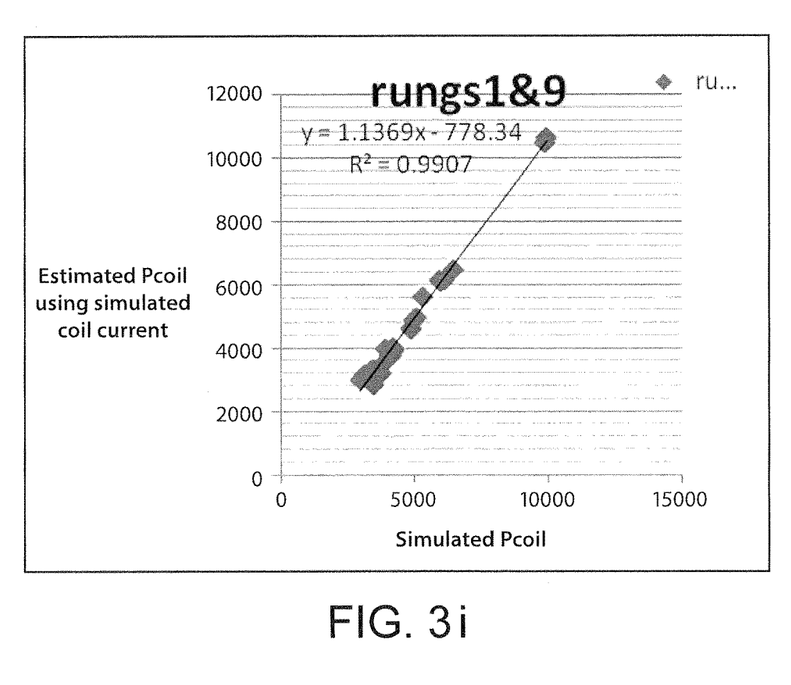

The purpose here is to determine loss in the coil by measuring current. However, the current is not uniform in the coil. Thus, to know the entire loss, a small number of plural measurement points may be used. Simulation results show that measuring all rungs (e.g., in a 16 rung birdcage body coil) provides the most accuracy (e.g., error of less than 2%) with various imaging samples. But four sampling points located spatially 90° apart and two sampling points located spatially 45° and 135° from coil feeding points are also practical. An arrangement of sixteen rung sampling points is depicted on the birdcage coil cross-section in FIG. 3e and simulated results for various combinations of rung samplings are depicted in FIGS. 3f-3i.

$P_{coil}$ estimation includes some error even when current is measured accurately (due to influences by current distribution changes on the coil). When current is measured at all sixteen rungs, the rms error is 2.1%. When four rungs 90° apart are measured, the rms error is 2.6-2.8%. When two rungs 180° apart are measured, rung 5 and rung 13 provide the most accuracy: rms error 3.7% while rung 1 and rung 9 provide 7.3% rms error which is not good.

One practical implementation would be to use two measurement points. Four measurement points might be required. Practical implementations may also require asymmetrical positioning (e.g., typically for shoulder or breast coils).

Figure 4:
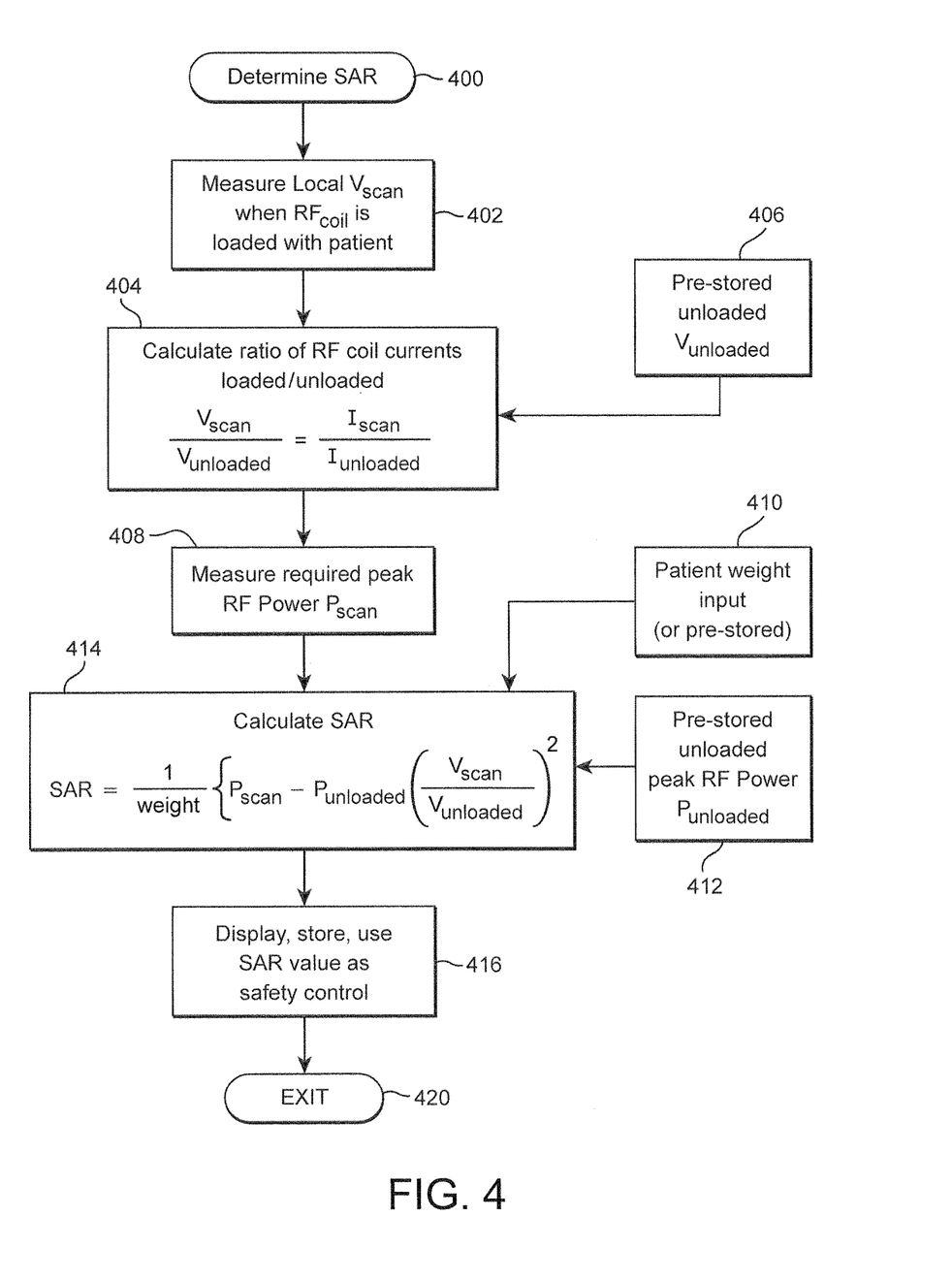
FIG. 4 is a schematic illustration of exemplary computer program code structure in the form of a flow chart for implementing an exemplary embodiment which more accurately determines SAR.

A suitable callable subroutine for determining SAR is entered at 400 in FIG. 4. It is assumed that this subroutine will be called during MRI scanning procedures when a patient is already loaded into the RF coil. However, as those in the art will appreciate, at some prior time, a similar subroutine can be provided for calibration purposes without the patient being loaded in the coil so as to obtain reference calibration values to be used in the SAR calculation.

With the patient loaded in the coil, the induced voltage $V_{scan}$ from the pickup coil is measured at 402. A pre-stored similar induced voltage from the pickup coil when the patient is not loaded into the coil is available at 406. The voltage ratio between the loaded and unloaded induced pickup coil voltages is, as described above, equal to the ratio of loaded and unloaded RF currents flowing in the coil, and this current ratio may be calculated at 404 (or, as in this exemplary embodiment, the equivalent measured voltage ratio may be used directly).

The required peak RF power for this particular patient's MRI scan is calculated, retrieved from memory and/or measured at 408. The patient's weight, of course, may have previously been inputted to the system and/or presently inputted and stored at 410. The unloaded peak RF power has also already been obtained during an earlier calibration mode and pre-stored at 412. Accordingly, the SAR for this particular patient is calculated at 414 in accordance with the previously described formula. The result can be displayed, stored or otherwise used (e.g., to terminate the scan or to sound an alarm to the operator if excessive SAR is detected)

at 416 before the subroutine is exited at 420 to a higher level calling program or operating system or the like, as those in the art will appreciate.

The ultimate parameter to be monitored is power consumption in the coil. If one assumes the coil resistance R to be constant, one can measure either current ($P=I^2*R$), near B field which is relative to the current, voltage across two points ($P=V^2/R$) or near E field which is relative to the voltage.

Figure 5:
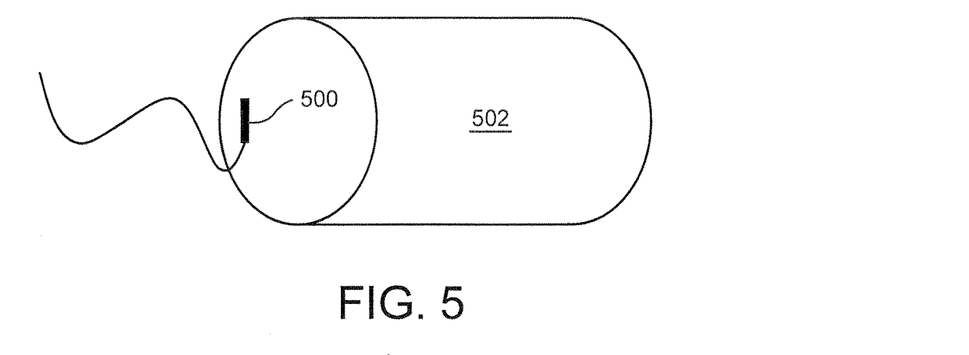
FIG. 5 schematically depicts an E-field probe placed in a transmit RF coil.

For example, an E-field probe 500 shown in FIG. 5 is placed in a transmit coil 502. The E field, for example, across a capacitor, is also related to current in the coil.

Figure 6A:
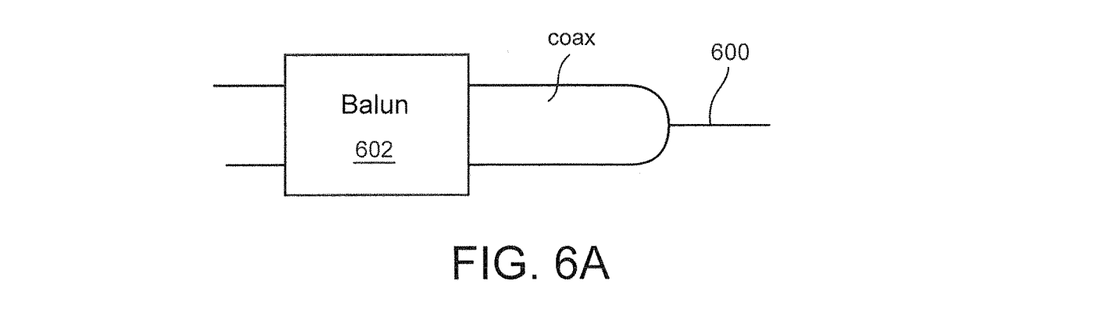
FIGS. 6A-6B depict a monopole E-field probe (and balun) made from coaxial cable and its exemplary placement with respect to RF coil capacitors.

An exemplary monopole E-field probe 600 shown in FIG. 6A is made of a coaxial cable where the coax inner conductor sticks out of the cut end of the outer conductor. A balun 602 is optional. In accordance with standard RF antenna design, the monopole length may be about one-quarter wavelength at an average Larmor frequency.

Figure 7A:
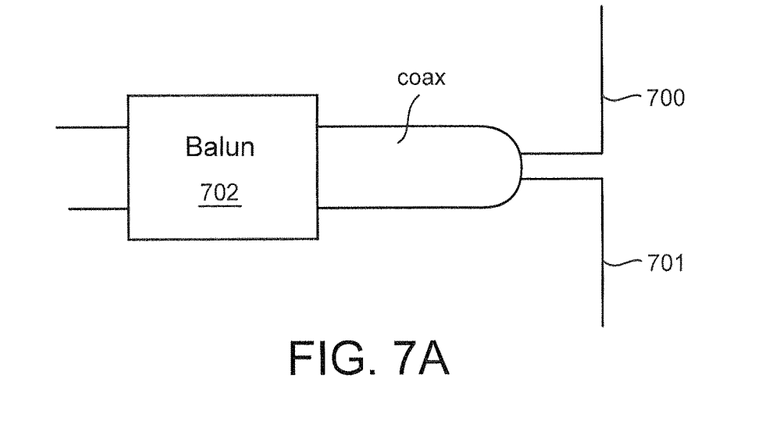
FIGS. 7A-7B depict a dipole E-field probe (and balun) made using coaxial cable and its exemplary placement with respect to RF coil capacitors.

An exemplary dipole E-field probe is shown in FIG. 7A. Two conductors 700, 701 are attached to an end of a coaxial cable, conductor 700 being connected to the coaxial cable shield, while conductor 701 is connected with the coaxial cable center conductor. The conductors 700 and 701 can each be about one-quarter wavelength at a mean Larmor frequency.

Figure 6B:
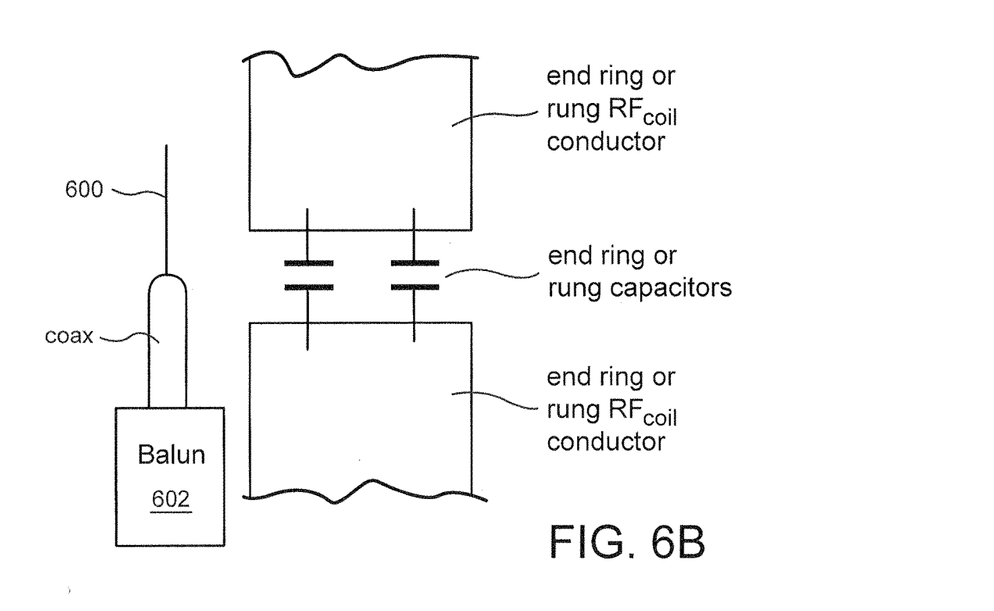
Figure 7B:
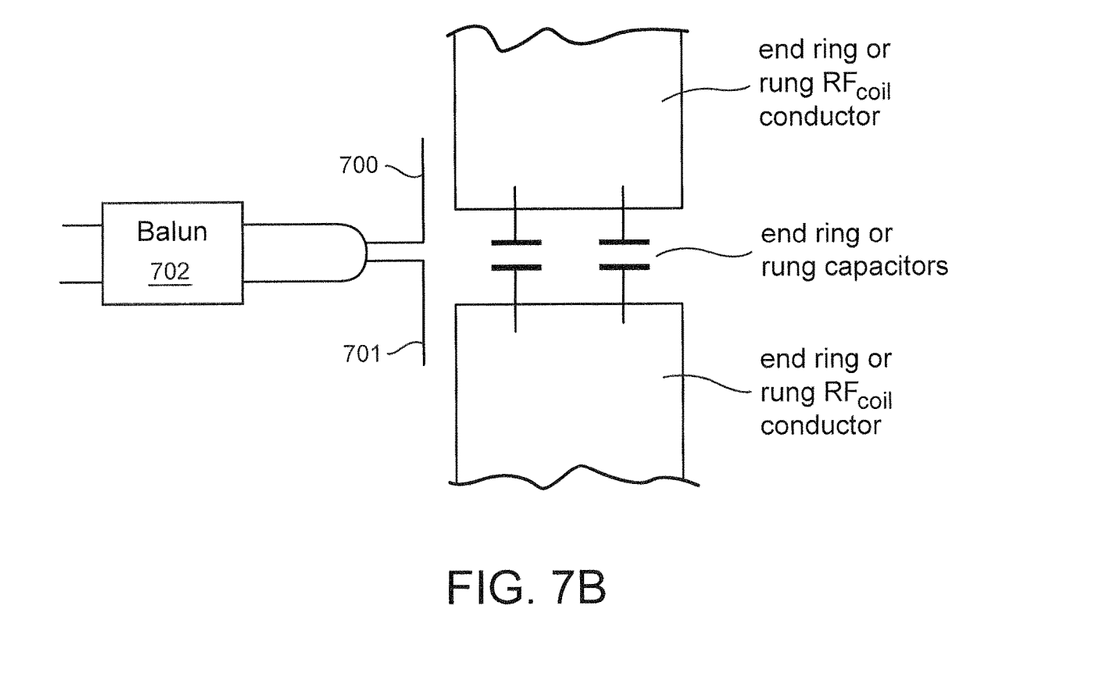

The E-field probes of FIGS. 6A and 7A may be placed beside an RF coil end ring capacitor (or a rung capacitor in case of low pass or bandpass birdcage coil) as show in FIGS. 6B and 7B, respectively.

Figure 8:
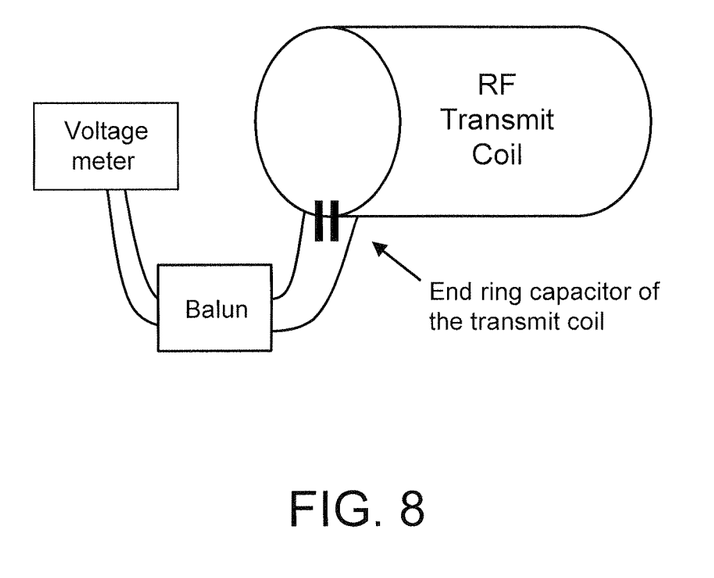
FIG. 8 schematically depicts a voltage drop probe for measuring the voltage drop across an RF coil capacitor.

FIG. 8 schematically depicts a voltage drop probe for measuring the voltage drop across an RF coil capacitor. Wires are attached to opposite sides of a coil capacitor (either end ring or rung depending on the coil type). Voltage across the component is related to the current in the coil conductor. A balun is optional. The voltage meter can be either next to the coil or remote. The meter should have high input impedance at the point where two wires are attached to the coil. The number of E-field or capacitor voltage probes used can be the same as above described for the small loop current monitor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) system comprising:
    static and gradient magnetic field generators, at least one radio frequency (RF) coil, at least one RF transmitter and at least one RF receiver;
    at least one power consumption monitor, inductively coupled directly to a respectively corresponding conductor of said RF coil so as to locally measure power actually being consumed by said RF coil due to current flowing within said RF coil conductor; and
    an MRI control system having at least one computer configured to:
        calculate during a patient imaging scan a specific absorption rate (SAR) for a patient coupled to said RF coil based on at least: (a) RF power transmitted to said RF coil while the RF coil is inductively coupled to the patient, and (b) electrical signals output from said at least one power consumption monitor while the RF coil is inductively coupled to the patient.

2. An MRI system as in claim 1, wherein said at least one-power consumption monitor comprises plural pickup loops spatially distributed at respectively different positions on said RF coil and electrical signals output from said plural pickup loops are combined for use in said determination of a specific absorption rate.

3. An MRI system as in claim 1, wherein said at least one-power consumption monitor comprises plural E-field probes spatially distributed at respectively different positions on said RF coil and electrical signals output from said plural E-field probes are combined for use in said determination of a specific absorption rate.

4. An MRI system as in claim 3, wherein each said E-field probe comprises a monopole RF antenna probe fed by coaxial cable.

5. An MRI system as in claim 3, wherein each said E-field probe comprises a dipole RF antenna probe fed by coaxial cable.

6. An MRI system as in claim 1, wherein said at least one-power consumption monitor comprises plural voltage measurement connections across respectively corresponding plural capacitors that are spatially distributed at different positions within said RF coil and electrical signals from said voltage measurement connections are combined for use in said determination of a specific absorption rate.

7. An MRI system as in claim 1, wherein said at least one-power consumption monitor comprises at least one butterfly or figure-eight shaped pickup loop electromagnetically coupled to current flowing in an RF coil conductor.

8. An MRI system as in claim 1, wherein said SAR is calculated using at least: (a) patient weight; (b) RF power transmitted to said RF coil while the RF coil is inductively coupled to the patient; (c) RF power transmitted to said RF coil while the RF coil is not inductively coupled to the patient; and (d) a comparison of power consumption monitor outputs when the RF coil is and is not coupled to the patient.

9. An MRI system as in claim 8, wherein said SAR is calculated using a corrected value for RF power transmitted to said RF coil while the RF coil is not inductively coupled to the patient based on comparison of RF power consumption when the RF coil is inductively coupled to the patient and when the RF coil is not inductively coupled to the patient.

10. An MRI system as in claim 9, wherein said SAR is calculated using a corrected value for RF power transmitted to said RF coil while the RF coil is not inductively coupled to the patient based on comparison of (i) output from at least one power consumption monitor while the RF coil is inductively coupled to the patient, and (ii) output from the at least one power consumption monitor while the RF coil is not inductively coupled to the patient.

11. A magnetic resonance imaging (MRI) system comprising:
    static and gradient magnetic field generators, at least one radio frequency (RF) coil, at least one RF transmitter and at least one RF receiver;
    at least one power consumption monitor coupled to locally measure power consumed by said RF coil; and
    an MRI control system having at least one computer configured to:
        determine a specific absorption rate (SAR) for a patient coupled to said RF coil based on at least: (a) RF power transmitted to said RF coil while the RF coil is inductively coupled to the patient, and (b) an electrical signal output from said at least one power consumption monitor while the RF coil is inductively coupled to the patient, wherein said SAR is calculated using the following formula:

$$SAR = \frac{1}{\text{weight}} \left\{ P_{scan} - P_{unloaded} \cdot \left( \frac{V_{scan}}{V_{unloaded}} \right)^2 \right\}$$

where:
weight=patient weight in kilograms;
$P_{scan}$=RF power transmitted to the RF coil when loaded with the patient for an MRI scan;
$P_{unloaded}$=RF power transmitted to the RF coil when not loaded with the patient for an MRI scan;
$V_{scan}$=an electrical output from at least one power consumption monitor when RF coil is loaded with patient for an MRI scan; and
$V_{unloaded}$=an electrical output from at least one power consumption monitor when RF coil is not loaded with patient for an MRI scan.

12. An MRI system as in claim 11, wherein calibration values for $P_{unloaded}$ and $V_{unloaded}$ are determined and pre-stored in memory for ready use in calculating SAR during subsequent MRI patient imaging procedures.

13. A magnetic resonance imaging (MRI) method comprising:
configuring and using an MRI system having static and gradient magnetic field generators, at least one radio frequency (RF) coil, at least one RF transmitter, at least one RF receiver, at least one power consumption monitor, inductively coupled directly to a respectively corresponding conductor of said RF coil so as to locally measure RF power consumed by said RF coil due to current flowing within said RF coil conductor, and an MRI control system having at least one configurable computer to:
calculate during a patient imaging scan a specific absorption rate (SAR) for a patient coupled to said RF coil based on at least: (a) RF power transmitted to said RF coil while the RF coil is inductively coupled to the patient, and (b) an output from said at least one power consumption monitor while the RF coil is inductively coupled to the patient.

14. An MRI method as in claim 13, wherein said at least one power consumption monitor comprises plural pickup loops spatially distributed at respectively different positions on said RF coil and electrical signals output from said plural pickup loops are combined for use in said determination of a specific absorption rate.

15. An MRI method as in claim 14, wherein said plural pickup loops are symmetrically distributed on said RF coil.

16. An MRI method as in claim 13, wherein said at least one power consumption monitor comprises at least one pickup loop having a butterfly or figure-eight shape electromagnetically coupled to current flowing in an RF coil conductor.

17. An MRI method as in claim 13, wherein said at least one power consumption monitor comprises plural E-field probes spatially distributed at respectively different positions on said RF coil and electrical signals output from said plural E-field probes are combined for use in said determination of a specific absorption rate.

18. An MRI method as in claim 17, wherein each said E-field probe comprises a monopole RF antenna probe fed by coaxial cable.

19. An MRI system as in claim 17, wherein each said E-field probe comprises a dipole RF antenna probe fed by coaxial cable.

20. An MRI system as in claim 13, wherein said at least one power consumption monitor comprises plural voltage measurement connections across respectively corresponding plural capacitors that are spatially distributed at different positions within said RF coil and electrical signals from said voltage measurement connections are combined for use in said determination of a specific absorption rate.

21. An MRI method as in claim 13, wherein said SAR is calculated using at least: (a) patient weight; (b) RF power transmitted to said RF coil while the RF coil is inductively coupled to the patient; (c) RF power transmitted to said RF coil while the RF coil is not inductively coupled to the patient; and (d) a comparison of power consumption monitor outputs when the RF coil is and is not coupled to the patient.

22. An MRI method as in claim 21, wherein said SAR is calculated using a corrected value for RF power transmitted to said RF coil while the RF coil is not inductively coupled to the patient based on comparison of RF coil power consumption when the RF coil is inductively coupled to the patient and when the RF coil is not inductively coupled to the patient.

23. An MRI method as in claim 22, wherein said SAR is calculated using a corrected value for RF power transmitted to said RF coil while the RF coil is not inductively coupled to the patient based on comparison of (i) output from at least one power consumption monitor while the RF coil is inductively coupled to the patient, and (ii) output from the at least one power consumption monitor while the RF coil is not inductively coupled to the patient.

24. A magnetic resonance imaging (MRI) method comprising:
configuring and using an MRI system having static and gradient magnetic field generators, at least one radio frequency (RF) coil, at least one RF transmitter, at least one RF receiver, at least one power consumption monitor disposed to measure RF power consumed by said RF coil, and an MRI control system having at least one configurable computer to:
determine a specific absorption rate (SAR) for a patient coupled to said RF coil based on at least: (a) RF power transmitted to said RF coil while the RF coil is inductively coupled to the patient, and (b) an output from said power consumption monitor while the RF coil is inductively coupled to the patient,
wherein said SAR is calculated using the following formula:

$$SAR = \frac{1}{\text{weight}} \left\{ P_{scan} - P_{unloaded} \cdot \left( \frac{V_{scan}}{V_{unloaded}} \right)^2 \right\}$$

where:
weight=patient weight in kilograms;
$P_{scan}$=RF power transmitted to the RF coil when loaded with the patient for an MRI scan;
$P_{unloaded}$=RF power transmitted to the RF coil when not loaded with the patient for an MRI scan;
$V_{scan}$=an electrical output from at least one power consumption monitor when the RF coil is loaded with patient for an MRI scan; and $V_{unloaded}$=an electrical output from at least one power consumption monitor when the RF coil is not loaded with patient for an MRI scan.

25. An MRI method as in claim 24, wherein calibration values for $P_{unloaded}$ and $V_{unloaded}$ are determined and pre-stored in memory for ready use in calculating SAR during subsequent MRI patient imaging procedures.

* * * * *